United States Patent
Barnes et al.

(10) Patent No.: US 6,706,138 B2
(45) Date of Patent: Mar. 16, 2004

(54) ADJUSTABLE DUAL FREQUENCY VOLTAGE DIVIDING PLASMA REACTOR

(75) Inventors: Michael S. Barnes, San Ramon, CA (US); John Holland, San Jose, CA (US); Alexander Paterson, San Jose, CA (US); Valentin Todorov, Fremont, CA (US); Farhad Moghadam, Saratoga, CA (US)

(73) Assignee: Applied Materials Inc., Santa Clara, CA (US)

( * ) Notice: Subject to any disclaimer, the term of this patent is extended or adjusted under 35 U.S.C. 154(b) by 43 days.

(21) Appl. No.: 09/931,324

(22) Filed: Aug. 16, 2001

(65) Prior Publication Data

US 2003/0037881 A1 Feb. 27, 2003

(51) Int. Cl.[7] ............................................. H01L 21/306
(52) U.S. Cl. ............................. 156/345.1; 156/345.23; 156/345.29; 156/345.34; 156/345.44
(58) Field of Search ........................ 156/345.1, 345.23, 156/345.29, 345.34, 345.44, 345; 216/67, 69, 71

(56) References Cited

U.S. PATENT DOCUMENTS

| | | | |
|---|---|---|---|
| 4,464,223 A | | 8/1984 | Gorin ........................ 156/643 |
| 4,579,618 A | | 4/1986 | Celestino et al. ........... 156/345 |
| 5,272,417 A | * | 12/1993 | Ohmi ..................... 315/111.21 |
| 5,512,130 A | | 4/1996 | Barna et al. ............. 156/651.1 |
| 5,585,012 A | * | 12/1996 | Wu et al. ..................... 216/71 |
| 6,013,155 A | | 1/2000 | McMillin et al. ........... 156/345 |
| 6,017,825 A | | 1/2000 | Kim et al. ................... 438/720 |
| 6,042,687 A | | 3/2000 | Singh et al. ................ 156/345 |
| 6,413,876 B1 | * | 7/2002 | Ohmoto et al. ............. 438/714 |

OTHER PUBLICATIONS

J. S. Logan, J. H. Keller, and R. G. Simmons, "The rf Glow Discharge Sputtering Model," Jan./Feb. 1977, pp. 92–97.

* cited by examiner

Primary Examiner—Nadine G. Norton
Assistant Examiner—Binh X. Tran
(74) Attorney, Agent, or Firm—Moser Patterson and Sheridan; Joseph Bach (57) ABSTRACT

Apparatus and method for processing a substrate are provided. The apparatus for processing a substrate comprises: a chamber having a first electrode; a substrate support disposed in the chamber and providing a second electrode; a high frequency power source electrically connected to either the first or the second electrode; a low frequency power source electrically connected to either the first or the second electrode; and a variable impedance element connected to one or more of the electrodes. The variable impedance element may be tuned to control a self bias voltage division between the first electrode and the second electrode. Embodiments of the invention substantially reduce erosion of the electrodes, maintain process uniformity, improve precision of the etch process for forming high aspect ratio sub-quarter-micron interconnect features, and provide an increased etch rate which reduces time and costs of production of integrated circuits.

12 Claims, 7 Drawing Sheets

ADJUSTABLE DUAL FREQUENCY VOLTAGE DIVIDING PLASMA REACTOR

BACKGROUND OF THE INVENTION

1. Field of the Invention

The present invention generally relates to a substrate processing chamber. More particularly, the invention relates to a method and apparatus for delivering power to a processing chamber.

2. Background of the Related Art

Plasma etching and reactive ion etching (RIE) have become important processes in precision etching of certain workpieces such as substrates in the fabrication of semiconductor devices. The differences between plasma etching and reactive ion etching, which generally can be carried out in the same equipment, typically result from different pressure ranges employed and from the consequential differences in mean free path of excited reactant species in a processing chamber. The two processes are collectively referred to herein as plasma etching. Plasma etching is a "dry etching" technique and has a number of advantages over conventional wet etching in which the workpiece is generally immersed in a container of liquid etchant material. Some of the advantages include lower cost, reduced pollution problems, reduced contact with dangerous chemicals, increased dimensional control, increased uniformity, improved etch selectivity, and increased process flexibility.

As integrated circuit densities increase, device feature sizes decrease below 0.25 micron while the aspect ratio (i.e., ratio of feature height to feature width) of the device features increase above 10:1. Improved precision of the etch process is required to form these small device features having high aspect ratios. Additionally, an increased etch rate is desired to improve throughput and reduce costs for producing integrated circuits.

One type of plasma etch chamber utilizes two parallel plate electrodes to generate and maintain a plasma of the process gases between the plate electrodes. Typically, a parallel plate plasma etch chamber includes a top electrode and a bottom electrode. The bottom electrode typically serves as a substrate holder, and a substrate (or wafer) is disposed on the bottom electrode. The etch process is performed on a surface of the substrate that is exposed to the plasma.

Typically, one or more of the electrodes are connected to a power source. In a particular parallel plate reactor, those electrodes are connected to high frequency power sources. The power source connected to the upper electrode is typically operated at a higher frequency than the power source connected to the lower electrode. This configuration is believed to avoid damage to materials disposed on a substrate.

Another parallel plate reactor has two power sources connected to a lower electrode. The power sources are each operated at different frequencies in order to control the etching characteristics resulting on a substrate being processed.

Yet another parallel plate reactor includes three electrodes. A first electrode is adapted to support a substrate and is connected to a low frequency AC power source. A second electrode is disposed in parallel relationship with the first electrode and is connected to ground. A third electrode (i.e., the chamber body) disposed between the first and second electrode is powered by a high frequency AC power source.

Another conventional apparatus provides a single powered electrode reactor. High and low frequency power supplies are coupled to the single electrode in an effort to increase process flexibility, control and residue removal. The single electrode reactor includes a multistage passive filter network. The network is intended to perform the functions of coupling both power supplies to the electrode, isolating the low frequency power supply from the high frequency power supply and attenuating the undesired frequencies produced by mixing of the two frequencies in the nonlinear load represented by the reactor.

A more detailed description of dual frequency parallel plate reactors can be found in U.S. Pat. No. 4,464,223, entitled "Plasma Reactor Apparatus and Method," assigned to Tegal Corp., and issued Aug. 7, 1984; U.S. Pat. No. 5,512,130, entitled "Method and Apparatus of Etching a Clean Trench in a Semiconductor Material," assigned to Texas Instruments, Inc., issued Apr. 30, 1996; U.S. Pat. No. 4,579,618, entitled "Plasma Reactor Apparatus, assigned to Tegal Corp., issued Apr. 1, 1986; and U.S. Pat. No. 5,272,417, entitled "Device for Plasma Process, issued Dec. 21, 1993.

One problem typically experienced in a parallel plate plasma etch chamber is that material from the surfaces of the top electrode exposed to the plasma in the chamber is also etched during the etch process. As the top electrode is eroded by the etch process, the material property of the top electrode changes and causes variations of the processing parameters in the chamber, which results in inconsistent or non-uniform processing of substrates. Furthermore, the top electrode may have a short useful life and may need to be replaced frequently, which increases the costs associated with production of the semiconductor devices.

Therefore, there is a need for a parallel plate plasma etch system that can substantially reduce erosion of the top electrode and maintain process uniformity. It would be desirable for the plasma etch system to improve precision of the etch process for forming high aspect ratio sub-quarter-micron interconnect features. It would be further desirable for the plasma etch system to provide an increased etch rate which reduces time and costs of production of integrated circuits.

SUMMARY OF THE INVENTION

The present invention generally provides a parallel plate plasma etch system that can substantially reduce erosion of a top electrode and maintain process uniformity. The plasma etch system improves precision of the etch process for forming high aspect ratio sub-quarter-micron interconnect features. The plasma etch system also provides an increased etch rate which reduces time and costs of production of integrated circuits.

In one aspect, the invention provides an apparatus for processing a substrate comprising a chamber having an electrode, a substrate support disposed in the chamber, a high frequency power source electrically connected to the electrode, a low frequency power source electrically connected to the electrode, and a variable impedance element connected between the substrate support and an electrical ground.

In one embodiment, the electrode comprises a gas distributor, and the electrode and the substrate support form parallel plate electrodes. The high frequency power source is adapted to deliver power at a frequency between about 13.56 MHz and about 500 MHz while the low frequency power source is adapted to deliver power at a frequency between about 100 kHz and about 20 MHz. The variable impedance element is adapted to tune a self bias voltage division between the electrode and the substrate support and is adapted to tune at least one resonant impedance at a frequency selected from at least one of the low frequency and the high frequency.

In another aspect, the invention provides a method for delivering power to a process chamber having a first electrode and a substrate support forming a second electrode comprising delivering a high frequency power from a high frequency power source electrically connected to the first electrode, delivering a low frequency power source from a low frequency power source electrically connected to the first electrode, and connecting a variable impedance element between the substrate support and an electrical ground. In one embodiment, the method further comprises tuning the variable impedance element to control a self bias voltage division between the first electrode and the substrate support. The variable impedance element may be tuned to provide a first resonant impedance at the low frequency and a second resonant impedance at the high frequency.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
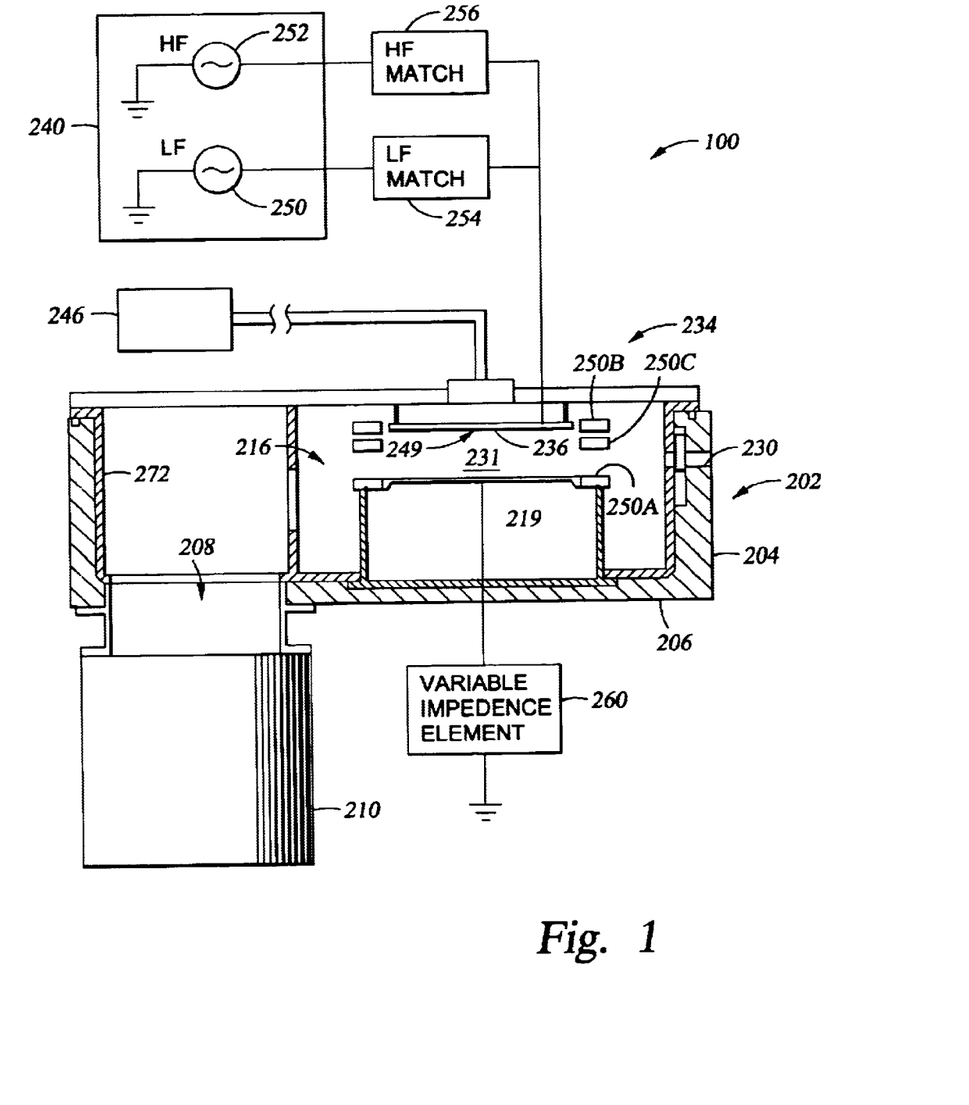
FIG. 1 is a schematic cross sectional view of a processing chamber according to aspects of the invention.

FIG. 1 is a schematic diagram of one embodiment of a parallel plate processing system 100 of the invention. The processing system 100 may be attached to a processing system platform and may comprise a multi-purpose chamber configured to perform a specific process, such as an etch process. Although the invention is described with respect to a particular configuration, it is understood that the invention is applicable in a variety of configurations and designs. Further, it is understood that the system is a simplified schematic representation and some aspects that may be part of the processing system 100 are not shown. For example, actuators, valves, sealing assemblies and the like are not shown. Persons skilled in the art will readily recognize that these and other aspects may be incorporated into the processing system 100.

The process chamber 100 generally includes a chamber body 202 defining a cavity 231 at least part of which is a processing region. The chamber body 202 includes a chamber wall 204 and a chamber bottom 206. The chamber wall 204 extends substantially perpendicularly from the edge of the chamber bottom 206. An opening 230 is formed in the chamber wall 204 and serves to facilitate substrate transfers into and out of the processing system 100. Although not shown, a slit valve may be provided to selectively seal the opening 230. The chamber bottom 206 includes an outlet 208 for exhausting gases from the chamber. An exhaust system 210 is attached to the outlet 208 of the chamber bottom 206. The exhaust system 210 may include components such as a throttle valve and a vacuum pump. Once the opening 230 is sealed, exhaust system 210 may be operated to draw and maintain a vacuum within the cavity 231.

A plate electrode 236 is disposed at an upper end of the chamber body 202. In one embodiment, the plate electrode 236 includes a protective coating 249 which prevents or reduces erosion of the material of the plate electrode 236 caused by the plasma in the chamber. The protective coating may comprise a material such as quartz, sapphire, alumina, SiC, SiN, and Si. Although the chamber is described having a plate electrode, other chamber designs having inductive, capacitive, or a combination of inductive and capacitive plasma sources may also be utilized.

In one embodiment, the plate electrode 236 is a showerhead of a gas distribution system. In such a configuration, the plate electrode 236 may be part of a lid assembly that is adapted to distribute gases into the cavity 231. Accordingly, FIG. 1 shows a gas source 246 coupled to the plate electrode 236. The gas source 246 contains the precursor or process gases to be utilized for processing the substrate in the chamber. The gas source 246 may include one or more liquid ampoules containing one or more liquid precursors and one or more vaporizers for vaporizing the liquid precursors to a gaseous state.

The plate electrode 236 is connected to a power source 240 which supplies RF power to the plate electrode for generating and maintaining a plasma in the chamber. The power source 240 includes a low frequency RF power source 250 and a high frequency RF power source 252. The low frequency RF power source 250 is connected to the plate electrode 236 through a low frequency match network 254 and enhances ion assisted etching at the substrate. The high frequency RF power source 252 is connected to the plate electrode 236 through a high frequency match network 256 and enhances dissociation of the process gases and plasma density. Each of the match networks 254, 256 may include one or more capacitors, inductors and other circuit components. The low frequency RF power source 250 may deliver RF power to the plate electrode 236 at a frequency at or below about 20 MHz while the high frequency RF power source 252 may deliver RF power to the plate electrode 236 at a frequency at or above 13.56 MHz. In one embodiment, the low frequency RF power source 250 delivers RF power to the plate electrode 236 at a frequency between about 100 kHz and about 20 MHz while the high frequency RF power source 252 delivers RF power to the plate electrode 236 at a frequency between about 13.56 MHz and about 500 MHz.

Preferably, the high and low frequencies do not overlap during operation. That is, the low frequency RF power source 250 is always operated a frequency below the frequency of the high frequency RF power source 252.

While the plate electrode 236 acts as a top electrode of a parallel plate electrode plasma reactor, a substrate support 216 acts as a lower electrode. The substrate support 216 is disposed in the cavity 231 and may be any structure suitable for supporting a wafer, such as an electrostatic chuck or a vacuum chuck. The substrate support 216 includes a support plate 219 defining a substrate supporting surface that is generally shaped to match the shape of a substrate supported thereon. Illustratively, the substrate supporting surface is generally circular to support a substantially circular substrate. In one embodiment, the substrate supporting surface is thermally connected to a substrate temperature control system, such as a resistive heating coil and/or fluid passages connected to a heating or cooling fluid system.

The system 100 may include liners or rings that are configured for various functions. Illustratively, the process system 100 may include three confinement rings 250A–C. In one embodiment, each ring is made of nickel, aluminum, or other metals or metal alloys appropriate for plasma processing, and may also include an anodized aluminum surface. The rings 250 may be a single piece construction or a multi-piece construction.

A first ring 250A is disposed about the support plate 219. A second ring 250B is disposed around the upper electrode. A third ring 250C is disposed between the first and second rings 250A–B. In operation, the rings act to confine the plasma in the region above the substrate between the plate electrode 236 and the substrate support 216. The rings confine the plasma laterally in the chamber and minimize losses to the walls of the chamber.

To provide an adjustable voltage division between the top electrode and the bottom electrode, a variable impedance element 260 is connected between the substrate support 216 and an electrical ground or a ground connection. The variable impedance element 260 may include one or more capacitors, inductors and other circuit components. One embodiment of the variable impedance element 260 is described below with reference to FIG. 2.

Figure 2:
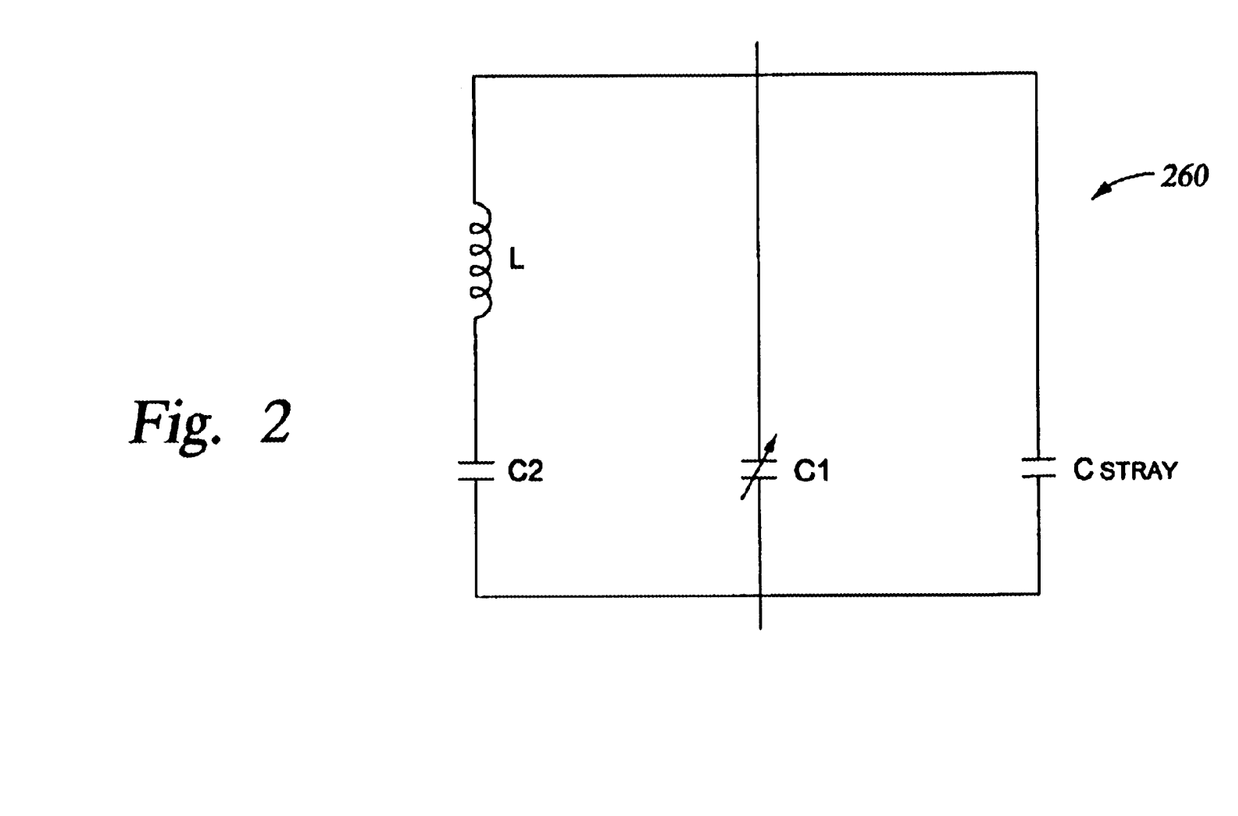
FIG. 2 is a schematic diagram of one example of a variable impedance element of the invention.

FIG. 2 is a schematic diagram of one example of a variable impedance element 260. As shown in FIG. 2, the variable impedance element 260 includes a capacitor C1 connected in parallel to a series combination of an inductor L and a capacitor C2. In one embodiment, the capacitors C1 and C2 may comprise variable capacitors which can be tuned to change the resonant frequency and the resonant impedance of the variable impedance element 260. A stray capacitance $C_{stray}$, which is parallel to capacitor C1, may be included in determining the resonant frequency and the resonant impedance of the variable impedance element 260.

The variable impedance element 260 can be tuned to change the self bias voltage division between the plate electrode 236 and the substrate support 216, at either or both of the low and high frequencies. A low resonant impedance at the high frequency (i.e., the frequency at which the high frequency power source is operating) provides high frequency plasma generation that is either equal between the plasma sheaths of both electrodes or slightly enhanced at the upper electrode. A high resonant impedance at the low frequency (i.e., the frequency at which the low frequency power source is operating) provides more self bias at the bottom electrode (i.e., substrate support), even though the substrate support is not directly connected to or powered by the power source. The increased self bias at the bottom electrode enhances the ion acceleration toward the bottom electrode, which provides improved etching results on a substrate disposed on the substrate support. Additionally, the increased self bias on the bottom electrode significantly reduces erosion of the top electrode or the protective covering on the top electrode.

To perform a plasma etch process, a substrate is transferred into the process chamber and positioned on the substrate support 216. The substrate support 216 may be moved into a processing position with a desired processing distance between the top electrode and the substrate support surface. The process/precursor gases are introduced into the chamber through the gas distributor, and a plasma is generated and maintained for a desired duration to complete the etch process on the substrate. Plasma etch processes may be performed utilizing reactive gases, such as $O_2$, $N_2$, Cl, HBr, $SF_6$, $CF_y$, $C_xF_y$, $C_xH_yF_z$, $NF_3$, and other etch precursors, with one or more inert gases, such as Ar, He, etc. The substrate is then transferred out of the process chamber.

The following table presents examples of chamber operating conditions for an etch process performed in one embodiment of a chamber of the invention.

| Processing Parameter | Parameter Value |
| --- | --- |
| Distance between top electrode and bottom electrode | About 0.5 cm to about 10 cm |
| Chamber Pressure | About 20 mT to about 1 Torr |
| Power Density | About 1 W/cm to about 20 W/cm |
| Frequency of Low Frequency Power Source | $\leq 20$ MHz |
| Frequency of High Frequency Power Source | $\geq 13.56$ MHz |

Figure 3:
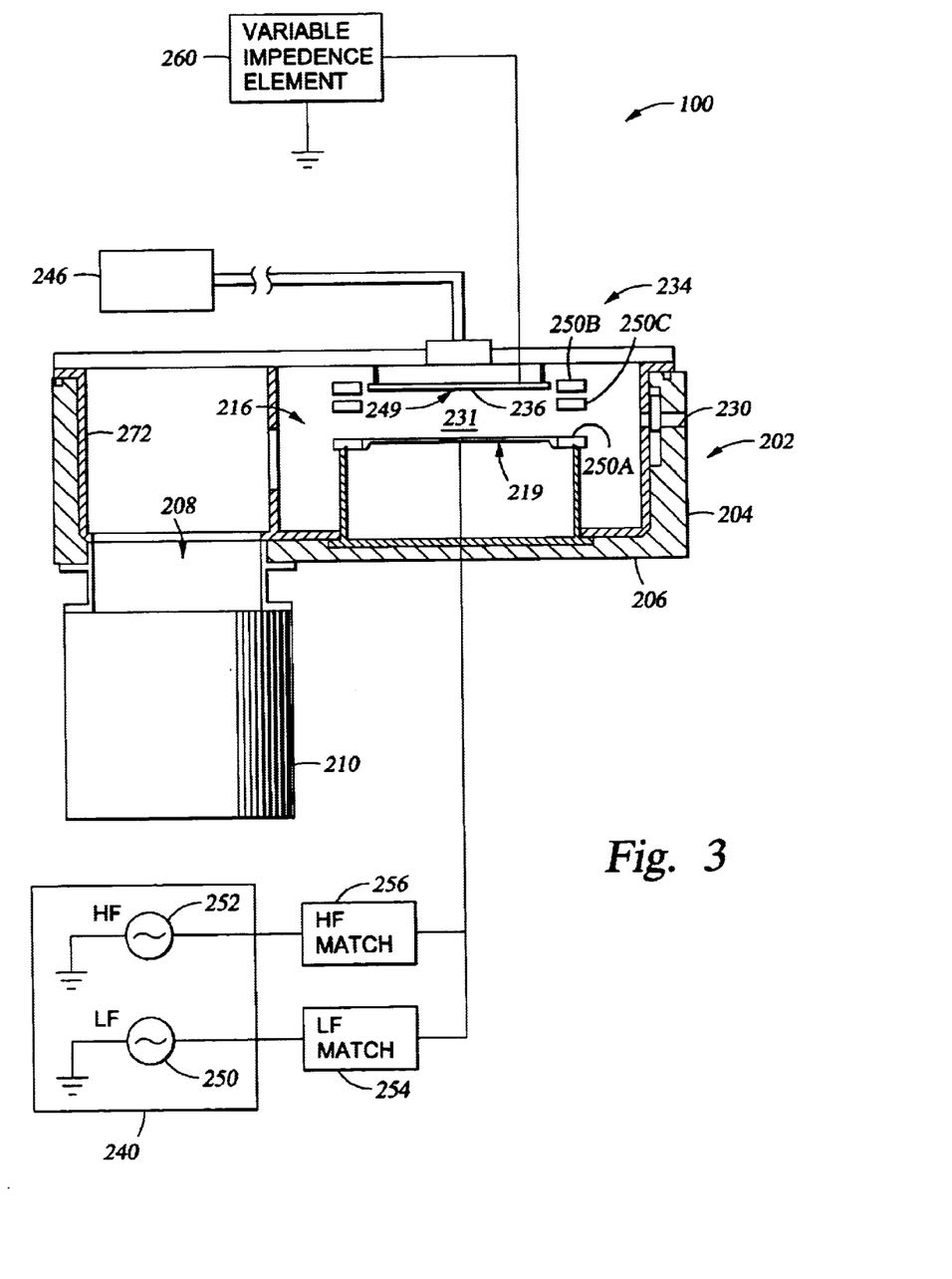
FIG. 3 is a schematic cross sectional view of another processing chamber according to aspects of the invention.

FIG. 3 is a schematic cross sectional view illustrating another embodiment of a chamber configuration and power delivery system. In this embodiment, the high and low frequency power are delivered to the substrate support member 216 through the HF match 256 and LF match 254, respectively. The variable impedance element 260 is connected to the plate electrode 236, such as a showerhead assembly, to adjust the RF power delivered to the processing region 231 by controlling the RF ground path impedance for the plate electrode 236. As the variable impedance is adjusted, the voltage drop across the processing region 231 changes accordingly. For example, as the variable impedance is adjusted to lower the impedance value, the current through the variable impedance element(s) 260 increases, increasing the voltage drop across the processing region 231, thereby increasing the RF energy transmitted. As the variable impedance element is adjusted to a higher impedance value, the voltage drop across the processing region 231 decreases, thereby departing less RF energy. In one aspect, the variable impedance can be adjusted in combination with the LF match 254 and HF match 256 to establish a desired plasma density without adversely affecting the HF 256 and LF 254 match between the RF power generators 250, 252 and the chamber 202. In one aspect, the tuning impedance of variable impedance element(s) 260 may be adjusted so that the sheath impedance and the variable impedance element(s) 260 are substantially in series resonance providing a substantially low impedance path for either the high or low frequency RF signals. Alternatively, the variable impedance element(s) 260 can be tuned above or below resonance for either RF signal to change the amount of RF current flowing through this electrode to ground.

Figure 4:
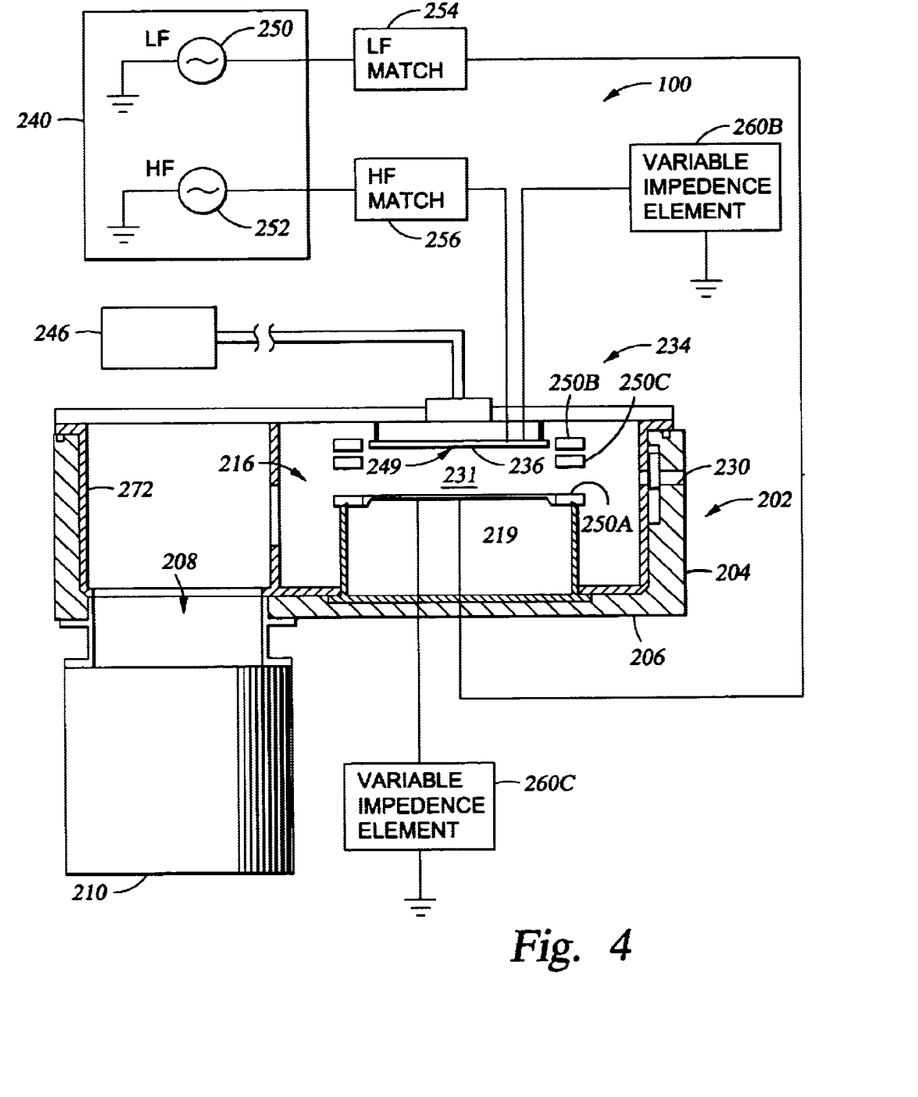
FIG. 4 is a schematic cross sectional view of another processing chamber according to aspects of the invention and including alternate ground returns for the high frequency and low frequency RF power.

FIG. 4 is a schematic cross sectional view illustrating another embodiment of a chamber configuration and power delivery system. In this embodiment, the high frequency power is delivered from the HF generator 252 to the plate electrode 236, such as a showerhead, and the low frequency power is delivered from the LF generator 250 to the substrate support member 216. An upper variable impedance element 260B is connected to the upper electrode 236 and a lower variable impedance element 260C is connected to the substrate support member 216. In this embodiment, the lower variable impedance element 260C provides a ground return path for the high frequency RF components from the HF generator 252 delivered to the processing region 231 and provides a high impedance path for the LF generator 250. In addition, the upper variable impedance element 260B provides a ground return path for the low frequency RF components from the LF generator 250 delivered to the processing region 231 and provides a high impedance path for the HF generator 252. Thus, the ratio of the delivered high frequency RF power to the delivered low frequency RF power may be independently adjusted and matched to the desired process parameters. In one aspect, the tuning impedance of the low frequency variable impedance element 260C may be adjusted so that the sheath impedance and the lower variable impedance element 260C are substantially in series resonance providing a substantially low impedance path for the low frequency RF signals. In another aspect, the tuning impedance of the high frequency variable impedance element 260B may be adjusted so that the sheath impedance and the high frequency variable impedance element 260C are substantially in series resonance providing a substantially low impedance path for the high frequency RF signals. Alternatively, the variable impedance element(s) 260B, 260C can be tuned above or below resonance to decrease the RF current at these frequencies from flowing through this electrode and/or change the self bias to this frequency.

Figure 5:
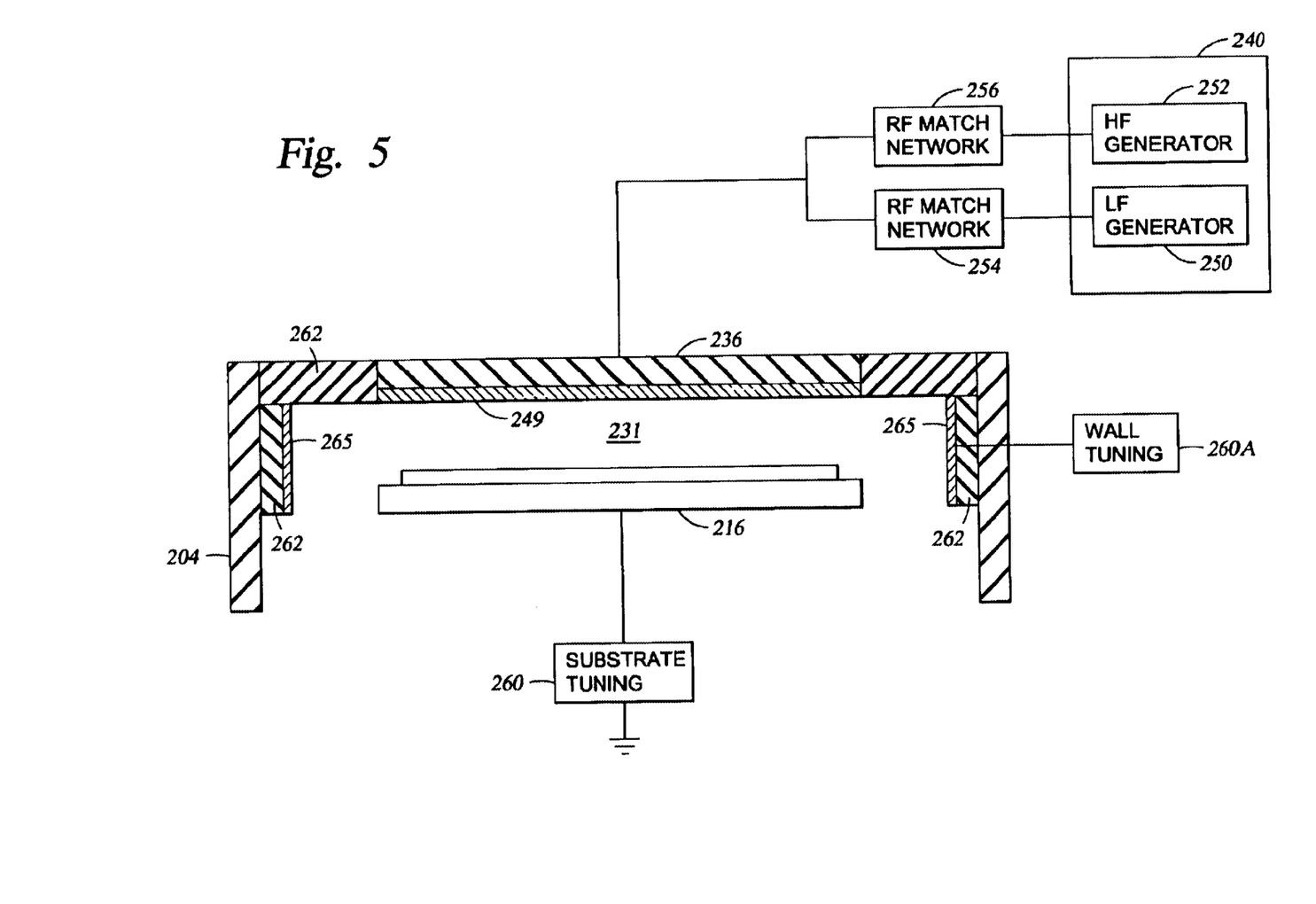
FIG. 5 is a schematic cross sectional view of another embodiment of a processing chamber according to aspects of the invention including a combined low and high frequency power source with chamber matching.

In another embodiment illustrated in FIG. 5, an isolated wall electrode 265 is provided and is connected to a wall tuning element 260A. The plate electrode 236 is adjacent to and horizontally spaced from the chamber wall 204 using an insulating material 262 selected from insulators such as ceramics, polymers, glass, and the like adapted to withstand the RF power applied to the plate electrode 236. The insulating material 262 electrically insulates the plate electrode 236 from the chamber wall 204 to allow the plasma to be directed under, and in substantial conformity with, the plate electrode 236. A wall electrode 265 composed of conductors such as aluminum, nickel, tungsten, and the like adapted to receive RF energy, is electrically isolated from the wall 204 and plate electrode 236 by the insulating material 262. The wall electrode 265 is adjacent to and vertically spaced from the chamber wall 204 forming an internal wall about processing region 231. A wall variable impedance element 260A is coupled to the wall electrode 265, providing an adjustable ground return path for RF energy proximate the chamber wall 204 from the plate electrode 236. The wall variable impedance element 260A is adapted to increase or decrease the RF energy to the support member 216 by providing an alternate ground path for the RF with respect to the support member 216. In one aspect, the wall variable impedance element 260A, in cooperation with the wall electrode 265, provides plasma confinement and control. To confine the plasma, the effective impedance between the plate electrode 236 and the wall electrode 265 is increased to a value great enough using the wall variable impedance 260A, to effectively minimize the RF path to ground, thereby constraining the plasma between the plate electrode 236 and the support member 216. Thus, the plasma adjacent to the wall is minimized, reducing the risk of plasma damage to the wall 204.

In another aspect, the plate electrode 236 and the wall impedance is adjusted to a value low enough to effectively decrease the RF path to ground impedance, shunting some of the RF power away between the plate electrode 236 and the support member 216, thereby decreasing the plasma density. Additionally, the spacing between the wall electrode 265 and the plate electrode 236 and/or support member 216 may be adjusted to allow for more or less confinement and control of the RF energy. Accordingly, the more confinement and control of the plasma which is realized, the closer the wall electrode 265 is placed to the plate electrode and/or the support 216.

Figure 6:
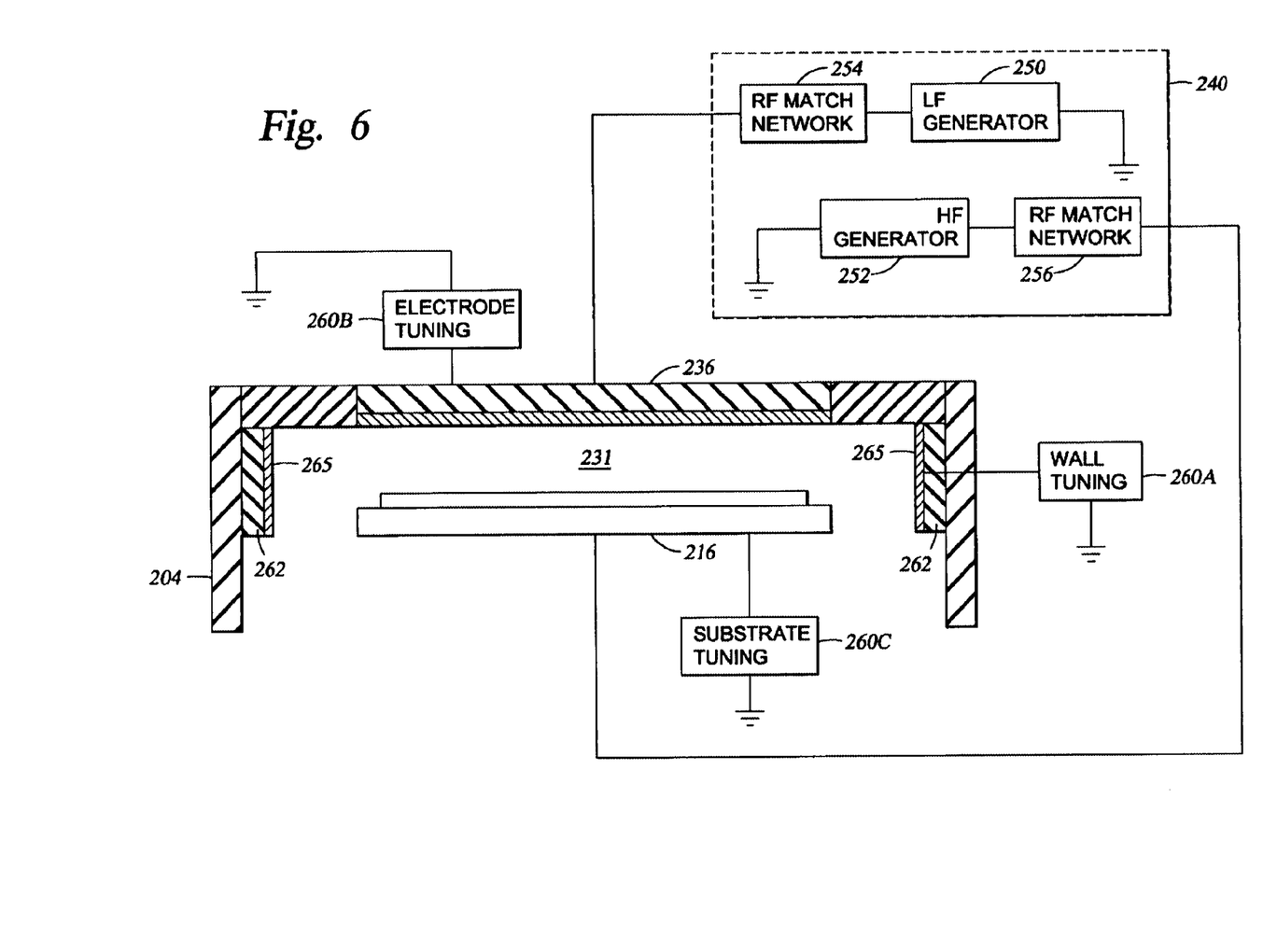
FIG. 6 is a schematic cross sectional view of another embodiment of a processing chamber according to aspects of the invention.

In another embodiment as illustrated in FIG. 6, the LF matching network 254 is coupled to the plate electrode 236 and the high frequency match 256 is coupled to the support member 216. An upper variable impedance element 260B is coupled to the plate electrode 236. A lower variable impedance element 260C is coupled to the support member to provide variable RF paths for the high frequency RF power source 252 and the low frequency RF power source 250, respectively. Each variable impedance element 260B–C may be adjusted to provide the proper RF return path as needed to adjust the voltage and current for each high or low frequency impedance path. The upper variable impedance element 260B is adapted to provide a ground return path for the high frequency RF components of the HF generator 252 and provide a high impedance path for the LF generator 250. The lower variable impedance element 260C is adapted to provide a ground return path for the low frequency RF components of the LF generator 250 and provide a high impedance path for the HF generator 252. The upper and lower impedance elements 260B, 260C may be separately adjusted to balance the amount of energy delivered from each RF generator 250, 252 to the processing region 231. Increasing the impedance of the lower variable impedance element 260C decreases the voltage drop across the processing region, increases the overall chamber impedance with respect to the LF match 254, and thereby lowers the low frequency RF current and power delivered to the processing region 231. In addition, increasing the impedance of the upper variable impedance element 260B decreases the voltage drop across the processing region 231, increases the overall chamber impedance with respect to the HF match 256, and thereby lowers the high frequency RF current and power delivered to the processing region 231. For example, the impedance of the upper variable impedance element 260B may be adjusted to allow more high frequency RF power to be applied to the substrate support member 216 while the impedance of the lower variable impedance element 260C may be increased to decrease the low frequency power delivered to the plate electrode 236. Thus, the ratio of the delivered high frequency RF power to the delivered low frequency RF power may be independently adjusted and matched to the desired process parameters. In one aspect, the tuning impedance of the upper variable impedance element 260B may be adjusted so that the sheath impedance and the upper variable impedance element 260B are substantially in series resonance providing a substantially low impedance path for the high frequency RF signals. In another aspect, the tuning impedance of the lower variable impedance element 260C may be adjusted so that the sheath impedance and the lower variable impedance element 260C are substantially in series resonance providing a substantially low impedance path for the low frequency RF signals. Alternatively, the variable impedance elements 260B, 260C can be tuned above or below resonance to reflect RF power back to the chamber as needed.

Figure 7:
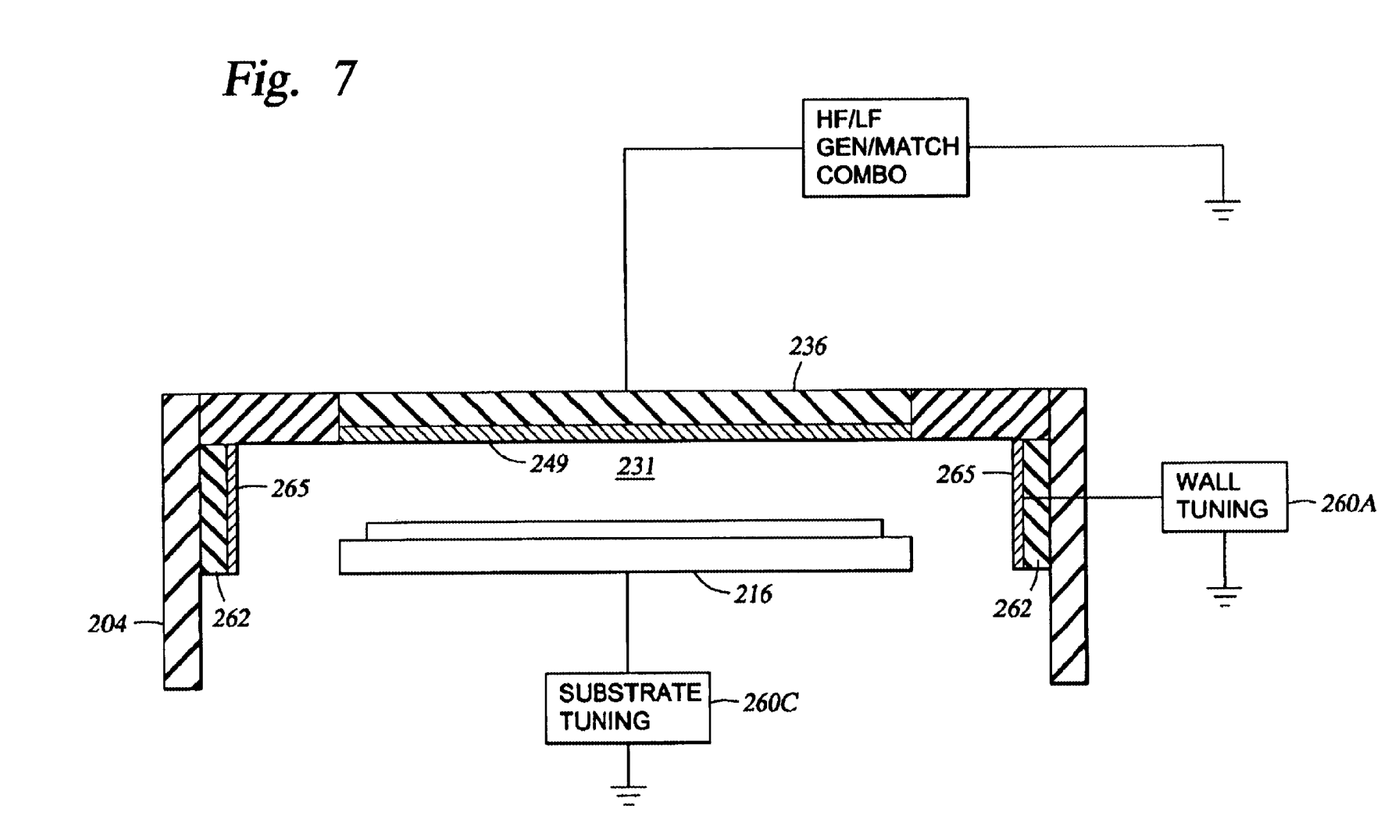
FIG. 7 is a schematic cross sectional view of another embodiment of a processing chamber according to aspects of the invention.

In another embodiment, as illustrated by FIG. 7, the low frequency RF power source 250, low frequency matching network 254, high frequency RF power source 252, and high frequency matching network 256, are combined into a single apparatus to minimize coupling and connection losses. The HF/LF Generator/Match combination is connected to the plate electrode. A wall electrode 265 and a wall tuning element 260A are provided to confine the plasma and minimize losses of the plasma to ground through the walls 204 of the chamber. Substrate tuning element 260C is connected to substrate support 216.

While the foregoing is directed to certain embodiments of the invention, other and further embodiments of the invention may be devised without departing from the basic scope thereof, and the scope thereof is determined by the claims that follow.

What is claimed is:

1. An apparatus for processing a substrate, comprising:
   a chamber having a first electrode disposed therein;
   a substrate support disposed in the chamber and providing a second electrode in the chamber;
   a high frequency power source electrically connected to either the first or second electrode;
   a low frequency power source electrically connected to either the first or second electrode; and
   one or more variable impedance elements connected to the first and/or second electrode, wherein each variable impedance element is disposed between the first and/or electrode second electrode and an electrical ground, wherein the variable impedance elements are adapted to tune a self bias voltage division between the first and second electrodes.

2. An apparatus for delivering power to a process chamber having a first electrode and a substrate support forming a second electrode, comprising:
   a high frequency power source electrically connected to the first electrode;
   a low frequency power source electrically connected to the first electrode; and
   a variable impedance element connected between the substrate support and an electrical ground.

3. The apparatus of claim 2, wherein the high frequency power source is adapted to deliver power between about 13.56 MHz and about 500 MHz.

4. The apparatus of claim 2, wherein the low frequency power source is adapted to deliver power between about 100 kHz and about 4 MHz.

5. The apparatus of claim 2, wherein the variable impedance element comprises at least one inductor and at least one capacitor.

6. The apparatus of claim 2, wherein the variable impedance element comprises at least one inductor and at least one variable capacitor.

7. The apparatus of claim 2, wherein the variable impedance element is adapted to tune at least one resonant impedance at a frequency selected from at least one of the low frequency and the high frequency.

8. The apparatus of claim 2, wherein the variable impedance element is adapted to tune a first resonant impedance at the low frequency and a second resonant impedance at the high frequency.

9. The apparatus of claim 2, wherein the first electrode comprises a gas distributor.

10. The apparatus of claim 2, wherein the first electrode and the substrate support are disposed to form parallel plate electrodes.

11. The apparatus of claim 2, wherein the chamber is configured as an etch chamber.

12. An apparatus for delivering power to a process chamber having a first electrode and a substrate support forming a second electrode, comprising:
    a high frequency power source electrically connected to the first electrode;
    a low frequency power source electrically connected to the first electrode; and
    a variable impedance element connected between the substrate support and an electrical ground, wherein the variable impedance element is adapted to tune a self bias voltage division between the first electrode and the substrate support.

* * * * *

UNITED STATES PATENT AND TRADEMARK OFFICE
CERTIFICATE OF CORRECTION

PATENT NO. : 6,706,138 B2
DATED : March 16, 2004
INVENTOR(S) : Barnes et al.

It is certified that error appears in the above-identified patent and that said Letters Patent is hereby corrected as shown below:

Column 9,
Line 33, please change "electrode second electrode" to -- second electrode --.

Signed and Sealed this

Twenty-third Day of November, 2004

JON W. DUDAS
*Director of the United States Patent and Trademark Office*